(12) United States Patent
Mehalel

(10) Patent No.: US 6,256,241 B1
(45) Date of Patent: Jul. 3, 2001

(54) SHORT WRITE TEST MODE FOR TESTING STATIC MEMORY CELLS

(75) Inventor: Moty Mehalel, Haifa (IS)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/539,222

(22) Filed: Mar. 30, 2000

(51) Int. Cl.[7] ........................................ G11C 7/00

(52) U.S. Cl. ...................... 365/201; 365/194; 365/154

(58) Field of Search ................................. 365/201, 194, 365/154, 156

(56) References Cited

U.S. PATENT DOCUMENTS

| | | |
|---|---|---|
| 4,956,819 | 9/1990 | Hoffmann et al. . |
| 4,958,324 | 9/1990 | Devin . |
| 4,999,813 | 3/1991 | Ohtsuka et al. . |
| 5,255,230 | 10/1993 | Chan et al. . |
| 5,493,532 * | 2/1996 | McClure ............................. 365/201 |
| 5,559,745 | 9/1996 | Banik et al. . |
| 5,570,317 * | 10/1996 | Rosen et al. ........................ 365/200 |
| 5,835,427 * | 11/1998 | McClure ............................. 365/201 |

* cited by examiner

Primary Examiner—Huan Hoang
(74) Attorney, Agent, or Firm—Jeffrey S. Draeger

(57) ABSTRACT

A short write test circuit and mode. One disclosed apparatus includes a memory cell that is connected to a first bit line and a second bit line. The short write test circuit causes a short write having a programmable duration to stress the memory cell.

19 Claims, 5 Drawing Sheets

SHORT WRITE TEST MODE FOR TESTING STATIC MEMORY CELLS

BACKGROUND

1. Field

The present invention pertains to the field of testing static random access memory cells.

2. Description of Related Art

A prior art static random access memory (SRAM) comprises an array of SRAM cells. Each SRAM cell is capable of storing a logical value using a pair of cross coupled devices such as inverters. Pullup gates in the cross coupled devices usually prevent leakage currents in the cell from discharging the internal data storage nodes of the cell.

Such an SRAM is typically implemented on an integrated circuit die according to a process technology that forms semiconductor and metal structures onto the integrated circuit die. The semiconductor structures usually include diffusion regions and polysilicon structures for the transistors in the SRAM. The metal structures often provide electrical interconnection between the transistors and other devices in the SRAM.

Such an integrated circuit process technology typically forms a plurality of contacts within each SRAM cell. Such contacts include contacts formed involving metal interconnect structures, polysilicon structures, and the diffusion regions of the transistors of the SRAM cell.

Defects sometimes occur in the semiconductor and metal structures of an integrated circuit during such a manufacturing process. Such manufacturing defects can cause failures in the contacts in the SRAM cells or in the individual transistors in the SRAM cells. A symmetric defect impairs the performance of both of the cross coupled devices of the cell. A defective contact in a power supply line which normally supplies power to the entire memory cell is considered a symmetric defect since both cross coupled devices are left without power. On the other hand, an asymmetric defect normally impairs only one of the cross coupled devices. A defective pullup in one inverter is an example of an asymmetric defect.

Manufacturing quality testing procedures are provided to detect such defects in newly manufactured integrated circuits. During a common manufacturing quality test procedure, the integrated circuits are placed in a highly specialized integrated circuit tester. Such a tester usually tests an SRAM by writing a predetermined data pattern to the SRAM cells and then immediately reading the SRAM cells to verify the stored data pattern. If the data written to the SRAM does not match the data read from the SRAM, then the SRAM is usually deemed defective.

Unfortunately, such a test procedure typically does not detect manufacturing defects that cause data retention problems in the SRAM cells. That is, defects that only show up after a cell has retained data for a relatively long period of time. For example, an SRAM cell having a defective pullup transistor at an internal data storage node retains stored charge for only a short period of time. The charge stored at the storage nodes of such an SRAM cell usually discharges through the diffusion regions of the transistors of the SRAM cell. A defective pullup transistor usually cannot maintain the charge level at the storage node for a long time.

One prior method for detecting such data retention defects is to provide a tester delay interval long enough to allow such a defective SRAM cell to discharge. That is, to increase the delay interval between the write of the test data pattern to the SRAM and the subsequent read-verify of the SRAM. Unfortunately, such tester delays significantly increase the time required for testing each integrated circuit. Consequently, more integrated circuit testers are necessary to obtain a certain throughput of integrated circuits when a data retention test including such a delay interval is used. The increased need for the extremely expensive integrated circuit testers results in a great increase in manufacturing costs.

One technique to avoid this cost is to include an on chip testing circuit to stress each SRAM cell. One such circuit is a weak write test circuit (see, e.g., U.S. Pat. No. 5,559,745). The weak write circuit applies a constant stress to a memory cell which should not flip a properly functioning memory cell. The weak write circuit, however, itself is subject to processing variations that may result in different die having stronger or weaker weak write circuits. This potentially may result in less precision and poor repeatability of testing from die to die.

BRIEF DESCRIPTION OF THE FIGURES

The present invention is illustrated by way of example and not limitation in the figures of the accompanying drawings.

DETAILED DESCRIPTION

The following description provides a short write test mode for testing static memory cells. In the following description, numerous specific details such as device technologies and signaling nomenclature are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement appropriate logic circuits without undue experimentation.

A short write test technique as disclosed herein may advantageously allow more reliable testing for defects which affect the ability of a static random access memory cell to retain logic values. The circuit is referred to as a "short write" test circuit because a write of a duration short enough to not trip a robust memory cell is performed. The strength of the short write driver circuit would be sufficient to trip a robust memory cell if the stress was applied indefinitely. A weak cell, however, may succumb to even the brief write pulse and trip, thereby indicating its defective status. This technique advantageously allows data retention faults to be detected without requiring long test cycles. This technique also allows greater control over the stress applied to the SRAM cells, thereby advantageously allowing fine tuning of testing to achieve more accurate results.

In the design phase, both the invested effort and the risk are kept low using the short write test circuit. That is because the exact stress applied may be determined and/or adjusted after design is complete. In contrast, developing a fixed circuit that attempts to automatically apply the proper stress across a wide spectrum of process and defect parameters may be a high effort task requiring great accuracy. In addition, the risk that such a fixed circuit will provide a stress that is too strong always exists due to modeling mistakes or unanticipated process changes. Thus, allowing the stress to be controlled during production using a variable duration write circuit reduces design complexity and reduces risk.

In production, using the disclosed short write test circuitry enables balancing between the number of escapees (released defective parts) with the yield loss incurred due to excessively stringent testing. The complex decision of drawing a line between good cells and bad cells may be performed with the benefit of high volume manufacturing characterization results.

Figure 1:
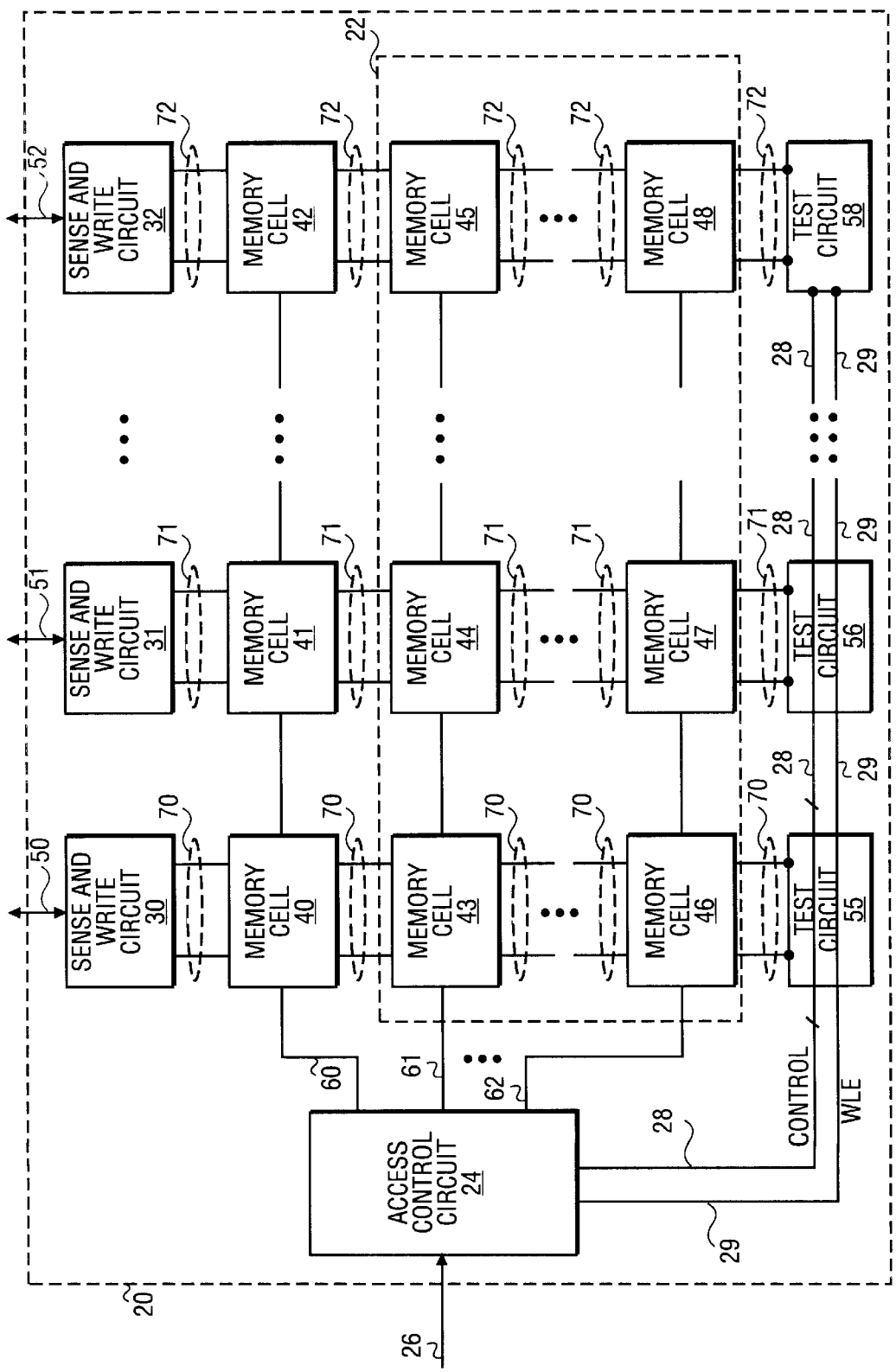
FIG. 1 is a schematic representation of one embodiment of a static random access memory.

FIG. 1 illustrates one embodiment of a static random access memory (SRAM) 20. The SRAM 20 comprises an access control circuit 24, a plurality of sense and write circuits 30–32, and a memory cell array 22. The memory cell array 22 comprises a plurality of memory cells 40–48. The SRAM 20 further comprises a plurality of short write test circuits 55–57, one associated with each column of memory cells.

The access control circuit 24 drives a plurality of word lines 60–62 of the memory cell array 22. The access control circuit 24 drives the word lines 60–62 to perform read and write operations to the memory cells 40–48 as is well known in the art. Each word line 60–62 corresponds to a row of the memory cell array 22. For example, the word line 60 corresponds to a row of the memory cell array 22 comprising the memory cells 40–42. Similarly, the word line 61 corresponds to a row of the memory cell array 22 comprising the memory cells 43–45, and the word line 62 corresponds to a row comprising the memory cells 46–48.

The sense and write circuits 30–32 are coupled to the bit lines 70–72 of the memory cell array 22. The sense and write circuits contain operational write circuits and sense amplifiers. The sense amplifiers differentially sense data on the bit lines 70–72 during read operations, and the operational write circuits drive data onto the bit lines 70–72 during write operations to the memory cell array 22. The sense and write circuits 30–32 also perform precharge operations that precharge the bit lines 70–72 to a predetermined voltage level. Well known circuits may be used for the sense and write circuits 30–32.

The bit lines 70–72 each comprise a pair of bit lines for a corresponding column of the memory cell array 22. For example, the bit lines 70 are coupled to a column of the memory cell array 22 comprising the memory cells 40, 43, and 46. Similarly, the bit lines 71 are coupled to a column comprising the memory cells 41, 44, and 47, and the bit lines 72 are coupled to a column comprising the memory cells 42, 45, and 48.

During a write cycle to the SRAM 20, the access control circuit 24 receives an address over an address bus 26, and the sense and write circuits 30–32 receive data over a plurality of data lines 50–52. Each sense and write circuit 30–32 receives a data bit over the corresponding data line 50–52. For example, the sense and write circuit 30 receives a data bit over the data line 50, the sense and write circuit 31 receives a data bit over the data line 51, and the sense and write circuit 32 receives a data bit over the data line 52.

The operational write circuits included in sense and write circuits 30–32 drive the received data onto the bit lines 70–72. The access control circuit 24 drives one of the word lines 60–62 according to the address received over the address bus 26 during the write operation. The activated word line 60–62 determines the row of the memory cell array 22 that is written with the data using decoding techniques well known in the art.

During a read cycle on the SRAM 20, the access control circuit 24 receives an address over the address bus 26. The access control circuit 24 decodes the received read address, and drives the appropriate word line 60–62. The activated word line 60–62 causes the corresponding row of the memory cell array 22 to drive data onto the bit lines 70–72. The sense amplifiers included in sense and write circuits 30–32 each detect a voltage differential on the corresponding bit lines 70–72 and amplify the voltage differential. The sense and write circuits 30–32 then drive the sensed data from the memory cell array 22 over the data lines 50–52 as is well known in the art.

Generally, according to presently disclosed techniques, the access control circuit 24 enables short write tests on the memory cell array 22 using short write control signals provided on a plurality of short write control lines 28 and a word line enable (WLE) control line 29. A short write test may include a series of write, short write, read-verify cycles performed row by row on the memory cell array 22. A write "0", short write "1", read-verify "0" series verifies the capability of the memory cells 40–48 to retain a "0". A write "1", short write "0", read-verify "1" series verifies the capability of the memory cells 40–48 to retain a "1".

The short write control signals are inactive during normal read and write cycles to the memory cell array 22, thereby maintaining the test circuits 55–57 inactive. The inactive test circuits 55–57 present relatively small capacitive loads and have minimal impact on the normal operation of the memory cell array 22. The capacitance of the bit lines 70–72 is relatively large compared to the test circuits 55–57 because a large number of memory cells are often coupled to each pair of the bit lines 70–72.

Figure 2:
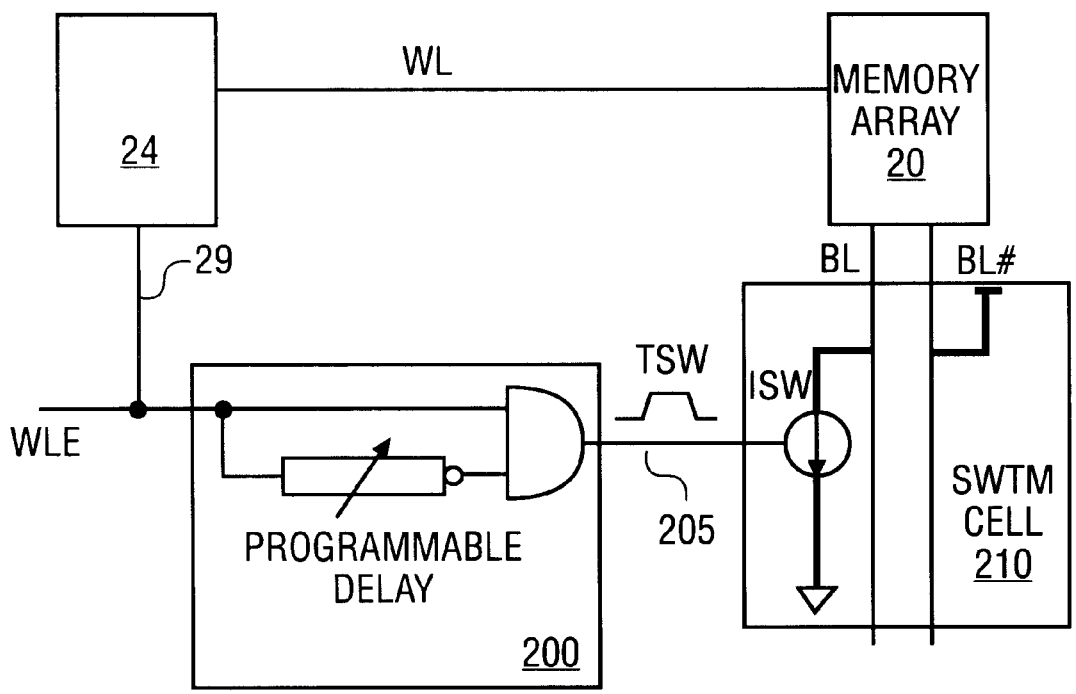
FIG. 2 is a block diagram of one embodiment of a short write test circuit in one test mode.

A block diagram of one embodiment of a short write test circuit performing a first test is shown in FIG. 2. In FIG. 2, the access control circuit 24, the memory array 20, a programmable pulse generator circuit 200 and a test circuit 210 are shown. A functional representation of the test circuit 210 is shown for one of two possible short write tests. As shown, the test circuit 210 applies a short write current ($I_{sw}$) to the bit line BL and holds BL# at the supply voltage, Vcc. In another mode, BL# is driven low and BL is coupled to the supply voltage. A word line enable signal (WLE) from and access control circuit 24 is used by the programmable pulse generator circuit 200 to generate a short write test pulse of duration $T_{sw}$ on a short write pulse line 205.

Figure 3:
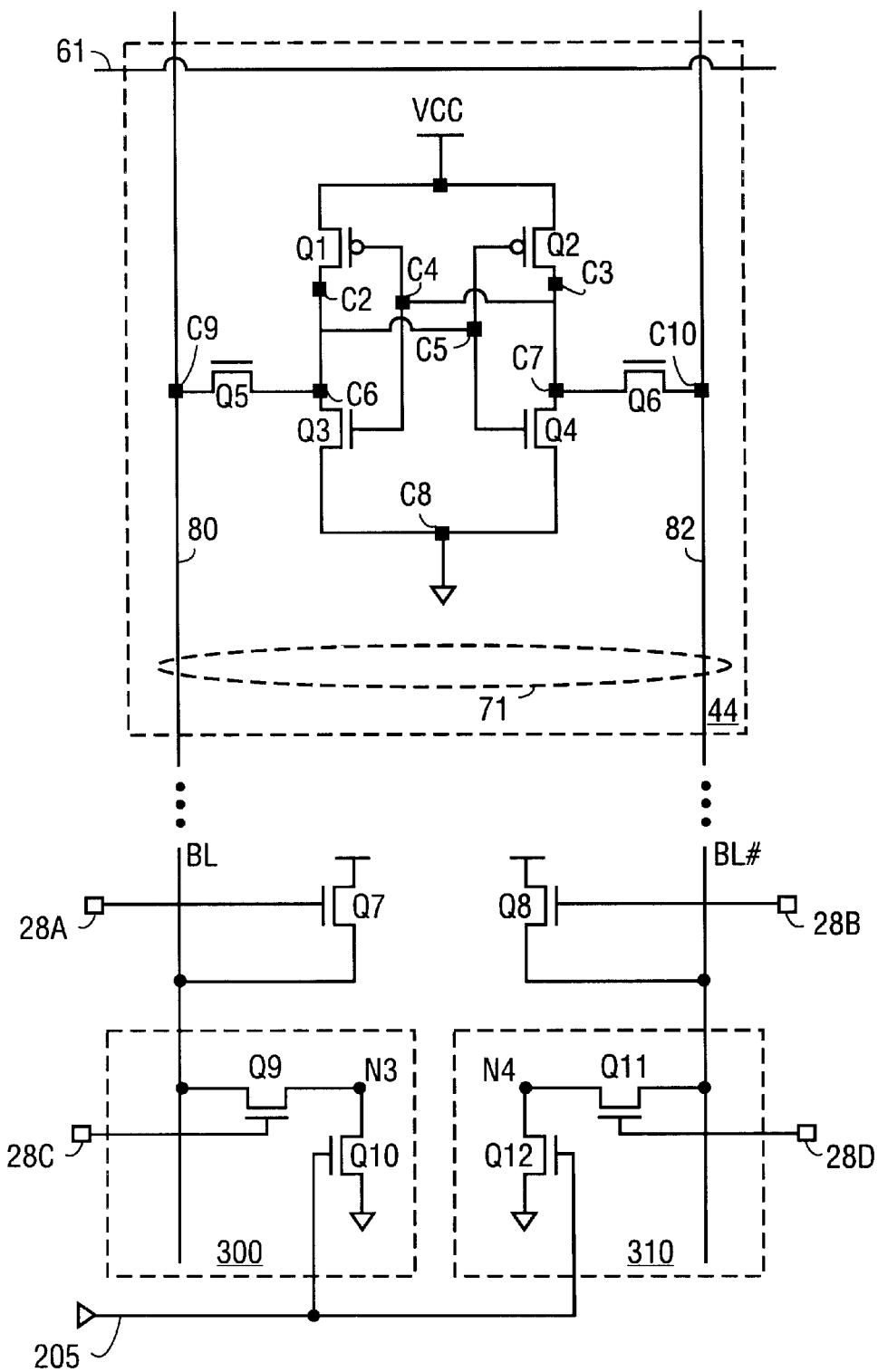
FIG. 3 illustrates further details of one embodiment of a short write test circuit.

FIG. 3 illustrates the memory cell 44 and the test circuit 56 for one embodiment. The memory cells 40–43, and 45–48 may be identical to the memory cell 44. The memory cell 44 comprises a plurality of transistors Q1–Q6. The transistors Q1–Q4 are arranged as cross coupled inverters. A first inverter is formed by the transistors Q1 and Q3. A second inverter is formed by the transistors Q2 and Q4. Flaws reducing the strength of pullup transistors such as the transistors Q1 and Q2 are one potential source of data retention defects.

The bit lines 71 comprise a bit line 80 and a complementary bit line 82. The transistor Q5 is a pass gate that connects an internal node N1 to the bit line 80. Similarly, the transistor Q6 is a pass gate that connects an internal node N2 to the bit line 82. The transistors Q5 and Q6 are activated via the word line 61.

A plurality of contacts c1–c10 include diffusion regions, polysilicon structures, and/or metal interconnect structures of the integrated circuit die that contains the SRAM 20. These contacts are another source of defects in the cells. Defective contacts may fail to provide a connection between the integrated circuit structures or may provide a highly resistive connection compared to other contacts.

The test circuit comprises a plurality of transistors Q7–Q12. The transistor Q7 is a pullup or charging device (e.g., a P channel MOS transistor) with a source coupled to a pullup voltage (Vcc), a drain coupled to BL 80, and a gate coupled to a first short write test control line 28A, which is one of the plurality of control lines 28 shown in FIG. 1. Q8 is also a pullup or charging device having its source coupled to Vcc, its drain coupled to BL#82, and its gate coupled to a second short write test control line 28B.

Transistors Q9 and Q1 form a first current source 300. Transistor Q9 is a pass transistor with its gate coupled to a third short write test control line 28C and its source and drain coupled to the BL 80 and a node N3. Transistor Q10 has its source coupled to node N3 and its drain coupled to a ground voltage supply line. The gate of transistor Q10 is coupled to the short write pulse line 205.

Transistors Q11 and Q12 form a second current source 310. Transistor Q11 is a pass transistor with its gate coupled to a fourth short write test control line 28D and its source and drain coupled to the BL#82 and a node N4. Transistor Q12 has its source coupled to node N4 and its drain coupled to a ground voltage supply line. The gate of transistor Q12 is coupled to the short write pulse line 205.

The following table illustrates the logical states of five control signals 28A–28D and 205 in the two short write test modes (short write logical 1, short write logical 0) and in normal operation (testing disabled).

TABLE 1

SWTM Control Signal States

| Mode | 28A-Q7 gate | 28B-Q8 gate | 28C-Q9 gate | 28D-Q11 gate | 205-Q10/Q12 gates |
|---|---|---|---|---|---|
| Short write 0 | 1 | 0 | 1 | 0 | Pulse |
| Short write 1 | 0 | 1 | 0 | 1 | Pulse |
| Normal | 1 | 1 | 0 | 0 | 0 |

In some embodiments, the short write test circuit may use identically sized devices in its current source circuits to those circuits used in the memory cells. For example, in the embodiment of FIG. 3, the transistors Q9 and Q10 may be sized identically to respectively transistors Q5 and Q3 in the memory cell. Similarly, transistors Q11 and Q12 may be sized identically to respectively transistors Q6 and Q4 in the memory cell. Sizing these transistors as such results in identical current sources (assuming no defects). Accordingly, process variations should advantageously affect both the memory cells and the test circuits in a similar manner.

Figure 4:
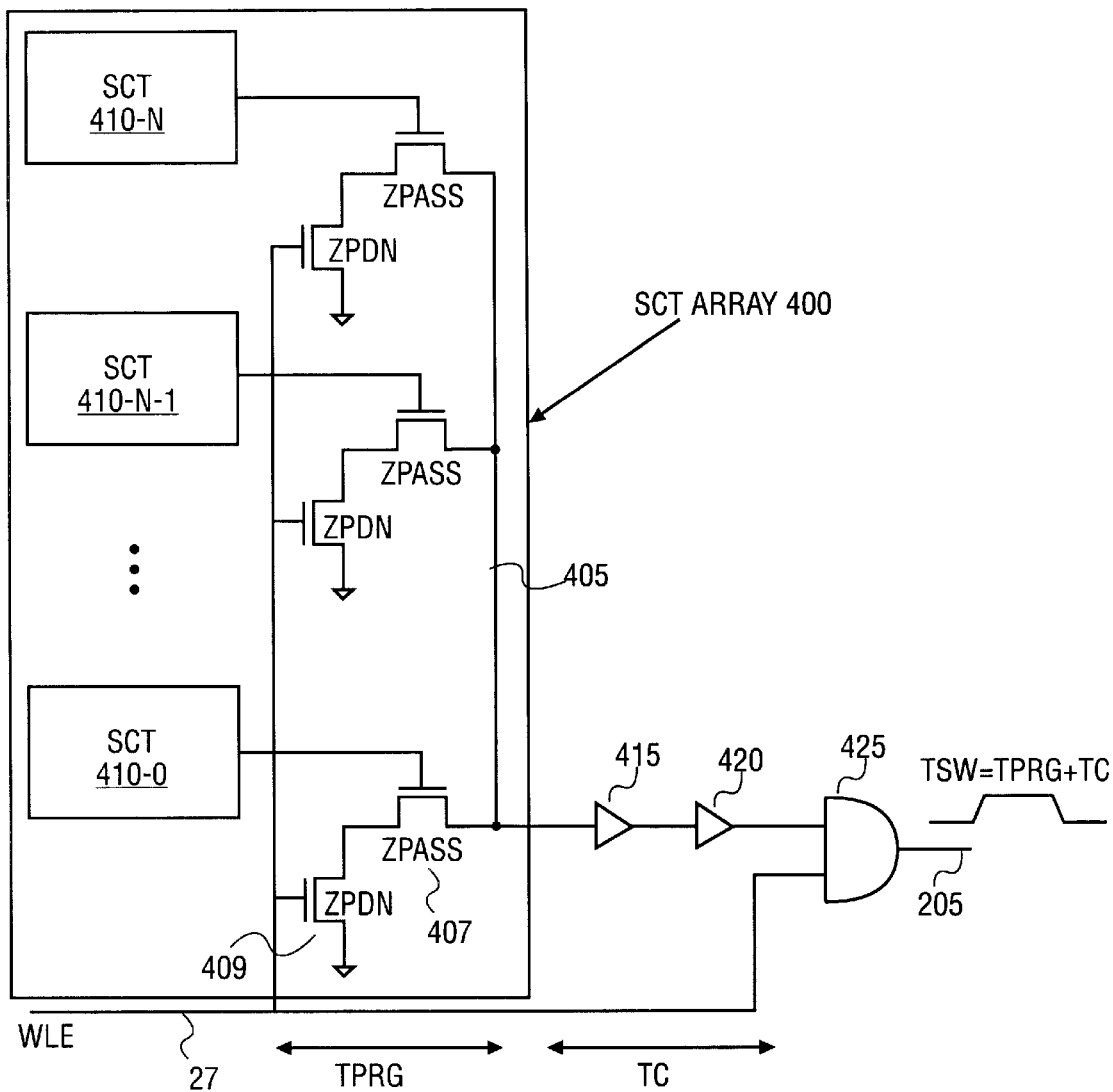
FIG. 4 illustrates details of one embodiment of a software controlled timing circuit to generate a short write test pulse.

FIG. 4 illustrates additional details for one embodiment of the programmable pulse generator circuit 200. In the embodiment of FIG. 4, the programmable pulse generator circuit 200 includes a software controlled timing (SCT) array 400. The software controlled timing array 400 includes a plurality of individual SCT memory elements, 410-0 through 410-N. Each SCT memory element controls a pass gate such as pass gate 407. Additionally, a pulldown transistor such as transistor 409 is associated with each SCT memory element. The pulldown transistors are controlled by the WLE signal from the signal line 29. Accordingly, the programmable portion of the delay ($T_{PRG}$) is varied by storing different values in memory elements. When the pass transistors are enabled, more pulldown transistors are connected in parallel, thereby a speeding the transition on signal line 405 and consequently shortening the programmable portion of the short write pulse duration. A constant portion ($T_c$) of the short write pulse is formed by a plurality of gates (e.g., buffers 415 and 420). The pulse itself is generated by an AND gate 425 in conjunction with the SCT array 400 and the buffers 415 and 420. Thus, in the illustrated embodiment, the total short write pulse duration includes a fixed portion and a programmable portion ($T_{sw}=T_{PRG}+T_c$). Other logical arrangements will be apparent to those of skill in the art. Additionally, in some embodiments, other programmable delay circuits may be used.

In some embodiments, the current source structures (e.g., the combination of transistors 407 and 409) in the SCT array are kept identical to the current sources in the short write test mode cell. That is, they are sized the same as the current sources in the test cell. Keeping such identical sizing ameliorates the impact of process changes as the various current sources are impacted similarly.

Figure 5:
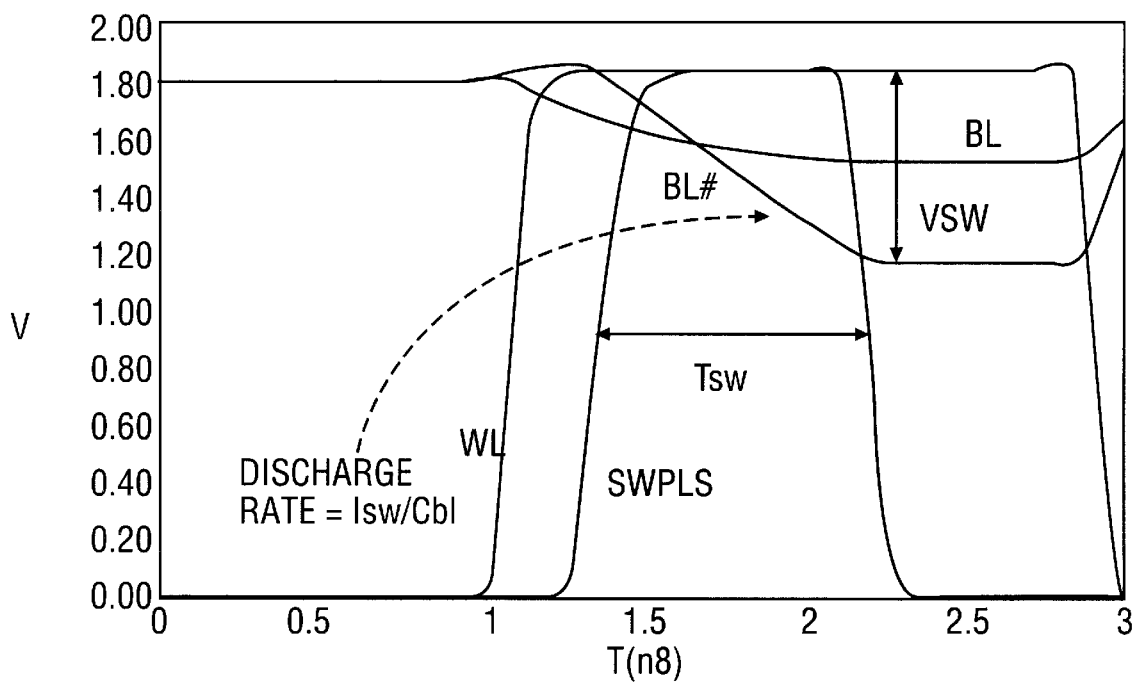
FIG. 5 is a timing diagram illustrating a short write cycle for one embodiment.

FIG. 5 illustrates waveforms occurring in one embodiment when BL# is driven low by the short write test circuit. The short write voltage ($V_{sw}$) is dependent on the programming of the SCT memory array (as reflected in $T_{sw}$), the current driven by the current source ($I_{sw}$) and the capacitance of the driven bit line. The voltages on the bit line BL and the inverted bit line BL# are shown. In FIG. 5, the memory recovers from the stress. A failing cell fails to return to its original value after the short write pulse is applied.

The following equation approximates the value of $V_{sw}$, assuming that the memory cell and test circuit current sources are identically sized.

$$V_{sw} = \frac{I_{sw} \cdot T_{sw}}{Cbl}$$

Assuming that Vcc/2 is the trip point of gate 415 in FIG. 4, the programmable delay (n=number of SCT memory cells enabled) may be approximated as:

$$T_{prg} = \frac{(Vcc/2) \cdot Cbl}{n * I_{sw}}$$

Thus, the short write voltage can be broken down into two components:

$$V_{sw} = \frac{Vcc}{2n} + \frac{I_{sw} \cdot T_c}{Cbl}$$

The first component is fixed due to identical sizing of the current sources in the short write test circuit and the transistors in the SCT array. The second component has counterbalancing parameters with respect to process variations. That is, the impacts on $T_c$ and $I_{sw}$ of process variations are in opposite directions. Accordingly, some embodiments advantageously maintain a small range of $V_{sw}$ for a fixed programmed delay over a wide variety of process variations, allowing for accurate trip point testing for memory cells. Additionally, since the delay is programmable, the desired trip point for failing cells may be adjusted as a result of high volume manufacturing characterization performed.

Thus, a short write test mode for testing static memory cells is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. An apparatus comprising:
   a memory cell to store a stored value, said memory cell being connected to a first bit line and a second bit line;
   a short write test circuit to cause a short write having a programmable duration of a new value to the memory cell, the short write providing a stress to the memory cell on only the first bit line which is a function of the programmable duration.

2. The apparatus of claim 1 wherein said short write test circuit is further to hold the second bit line to a supply voltage level.

3. The apparatus of claim 1 wherein said stress is a strong stress that, if applied for a sufficient duration, overwrites said stored value.

4. The apparatus of claim 2 wherein said short write test circuit is to drive said first bit line to an intermediate level that is determined to be higher than a trip point for a good cell.

5. The apparatus of claim 2 further wherein said short write test circuit is also to provide a second stress to the memory cell on the second bit line while holding the first bit line to the supply voltage level.

6. The apparatus of claim 1 wherein said short write test circuit comprises:
   a programmable delay line;
   a current source coupled to said first bit line and coupled to the programmable delay line to drive the first bit line toward a ground level for the programmable duration; and
   a pullup transistor coupled to said second bit line.

7. The apparatus of claim 6 wherein said current source comprises:
   a pass transistor coupled to said first bit line;
   a pulldown transistor coupled to said pass transistor and to a ground voltage supply.

8. The apparatus of claim 7 wherein said memory cell includes a first memory cell pass transistor and a first memory cell pulldown transistor and wherein said pass transistor and said pulldown transistor are sized identically to respectively said first memory cell pass transistor and said first memory cell pulldown transistor.

9. The apparatus of claim 6 further comprising:
   a second current source coupled to said second bit line and coupled to the programmable delay line to drive the second bit line to the ground level for the programmable duration as a part of a second short write test;
   a second pullup transistor coupled to the first bit line, wherein said current source and said pullup transistor are to be enabled in a short write 0 test mode and said second pullup transistor and said second current source are to be enabled in a short write 1 test mode.

10. A method comprising:
    programming a programmable duration for a short write test;
    stressing a static memory cell applying a stress voltage on only a first bit line for the programmable duration.

11. The method of claim 10 further comprising:
    applying a supply voltage to a second bit line.

12. The method of claim 10 wherein stressing comprises:
    enabling a test transistor of equivalent size to a memory cell transistor for the programmable duration.

13. The method of claim 12 wherein enabling comprises:
    enabling a test pulldown transistor and a test pass gate of equivalent sizes to pass gates and pulldown transistors in said static memory cell.

14. The method of claim 10 wherein stressing comprises:
    applying a strong stress that, if applied for a sufficient duration, is sufficiently strong to overwrite a value stored in said static memory cell.

15. A static random access memory comprising:
    a plurality of memory cells;
    a programmable short write test pulse generator;
    a short write test circuit to stress each of said plurality of memory cells with a strong stress sufficient to overwrite values stored in said plurality of memory cells, said strong stress being programmable in strength by adjusting a pulse length generated by said programmable short write test pulse generator, wherein said short write test circuit includes stress transistors of identical size to those in the plurality of memory cells.

16. The static random access memory of claim 15 wherein said short write test circuit applies a stress voltage to a first bit line during a first short write test.

17. The static random access memory of claim 16 wherein said short write test circuit applies a supply voltage to a second bit line during the first short write test.

18. The static random access memory of claim 17 wherein said short write test circuit applies a second stress voltage to the second bit line during a second short write test.

19. The static random access memory of claim 18 wherein said short write test circuit applies the supply voltage to the first bit line during the second short write test.

* * * * *

UNITED STATES PATENT AND TRADEMARK OFFICE
CERTIFICATE OF CORRECTION

PATENT NO. : 6,256,241 B1
DATED : July 3, 2001
INVENTOR(S) : Mehalel

It is certified that error appears in the above-identified patent and that said Letters Patent is hereby corrected as shown below:

<u>Column 5,</u>
Line 17, "Q1", insert -- Q10 --.

Signed and Sealed this

Seventh Day of May, 2002

Attest:

JAMES E. ROGAN
*Attesting Officer*  *Director of the United States Patent and Trademark Office*